United States Patent
Saha et al.

(10) Patent No.: US 8,183,871 B2
(45) Date of Patent: *May 22, 2012

(54) METHOD AND DEVICE FOR FAULT LOCATION IN A TWO-TERMINAL TRANSMISSION OR DISTRIBUTION POWER LINE

(75) Inventors: Murari Saha, Västerås (SE); Eugeniusz Rosolowski, Wroclaw (PL); Jan Izykowski, Wroclaw (PL)

(73) Assignee: ABB Technology Ltd., Zürich (CH)

( * ) Notice: Subject to any disclaimer, the term of this patent is extended or adjusted under 35 U.S.C. 154(b) by 985 days.

This patent is subject to a terminal disclaimer.

(21) Appl. No.: 12/160,552

(22) PCT Filed: Sep. 11, 2006

(86) PCT No.: PCT/EP2006/066229
§ 371 (c)(1),
(2), (4) Date: Jul. 10, 2008

(87) PCT Pub. No.: WO2007/079990
PCT Pub. Date: Jul. 19, 2007

(65) Prior Publication Data
US 2010/0277181 A1    Nov. 4, 2010

(30) Foreign Application Priority Data
Jan. 12, 2006   (SE) ...................... 0600119

(51) Int. Cl.
  *G01R 31/08* (2006.01)
  *G01R 31/00* (2006.01)
(52) U.S. Cl. .......................................... 324/522; 702/59
(58) Field of Classification Search ................. 324/522, 324/525; 702/59
See application file for complete search history.

(56) References Cited

U.S. PATENT DOCUMENTS

| 4,559,491 A | 12/1985 | Saha |
| 6,097,280 A * | 8/2000 | Takeda et al. ................. 340/3.44 |
| 6,256,592 B1 | 7/2001 | Roberts et al. |
| 6,529,010 B1 * | 3/2003 | Saha et al. .................... 324/525 |

FOREIGN PATENT DOCUMENTS

WO   WO-03/044547 A1   5/2003

OTHER PUBLICATIONS

PCT/ISA/210—International Search Report—Feb. 14, 2007.
PCT/ISA/237—Written Opinion of the International Searching Authority—Feb. 14, 2007.
Damir Novosel et al.; Unsynchronized Two-Terminal Fault Location Estimation; IEEE Transactions on Power Delivery, vol. 11, No. 1; Jan. 1996; pp. 130-138.
Sukumar M. Brahma et al; Fault Location on a Transmission Line Using Synchronized Voltage Measurements; IEEE Transactions on Power Delivery, vol. 19, No. 4, Oct. 2004; pp. 1619-1622.

* cited by examiner

*Primary Examiner* — Amy He
(74) *Attorney, Agent, or Firm* — Venable LLP; Eric J. Franklin

(57) ABSTRACT

A method for locating a fault in a two-terminal power transmission or distribution line. Measurements of the three phase currents are received from both terminals. Measurements of the three phase voltages are received from one line terminal. Parameters of the line are received. The fault type is received. Based on this received information the distance to fault from the one terminal where the phase voltages were measured is determined and output. Since only the phase voltages of one line terminal are needed, the functionality of a device, in particular a current differential relay, can be expanded to determine the distance to fault in an off-line mode.

8 Claims, 6 Drawing Sheets

METHOD AND DEVICE FOR FAULT LOCATION IN A TWO-TERMINAL TRANSMISSION OR DISTRIBUTION POWER LINE

CROSS-REFERENCE TO RELATED APPLICATIONS

This application claims priority to Swedish patent application 0600119-2 filed 12 Jan. 2006 and is the national phase under 35 U.S.C. §371 of PCT/EP2006/066229 filed 11 Sep. 2006.

TECHNICAL FIELD

This invention relates to a method and a device for locating a fault within a two-terminal power transmission or distribution line.

BACKGROUND OF THE INVENTION

Power transmission lines carry electric power from generating sources to users. The power transmission lines are typically high voltage lines and the electric voltage is typically transformed to a lower voltage at a power substation, before being distributed to individual electric power users such as homes, factories, business buildings etc. At many power substations, protective relays are installed.

The detection of a fault in the line involves measuring critical system parameters and, when a fault occurs, quickly making a rough estimate of the fault location and of certain characteristics of the fault so that the faulted line can be isolated from the power grid as quickly as possible. A fault occurs when a transmission line, typically due to external causes, diverts electrical current flow from its normal path along the transmission line.

The major types and causes of faults are insulation faults, caused by design defects, manufacturing defects, improper installation, and aging insulation; electrical faults, caused by lightning surges, switching surges, and dynamic overvoltages; mechanical faults, caused by wind, snow, ice, contamination, trees, and animals; and thermal faults, caused by overcurrent and overvoltage conditions.

A transmission line may include three phase lines; however, a transmission line may also contain one phase, or some other number of phases.

PRIOR ART

The issue of locating faults in two-terminal power transmission or distribution lines has been disclosed in different prior art, where two-terminal line means that on each of the two ends of the line a terminal is placed.

In M. Kezunovic and B. Perunicic, ("Automated transmission line fault analysis using synchronized sampling at two ends", IEEE Trans. on Power Systems, pp. 441-447, PS-11, 1996) the use of complete measurements of three-phase currents and voltages from both terminals of the line has been considered for fault location. These measurements were assumed as being synchronized, i.e. to have a common time reference.

In the following, the phrase "complete measurements" describes the fact that currents and voltages of both ends and of all phases of the transmission or distribution line are measured and are being available as a complete set of measurements.

Similarly, the availability of complete two-terminal measurements has been considered in NOVOSEL D. ("Automatic fault location system", U.S. Pat. No. 5,455,776; 3 Oct. 1995), in D. Novosel, D. G. Hart, E. Udren and J. Garitty J, ("Unsynchronized two-terminal fault location estimation", IEEE Trans. on Power Delivery, vol. 11, pp. 130-138, No. 1, 1996), and in Girgis A. A., Hart D. G., Peterson W. L., ("A new fault location technique for two- and three-terminal lines", IEEE Trans. Power Delivery, Vol. 7, No. 1, pp. 98-107, January 1992).

However, the measurements are considered as acquired asynchronously. Prior to calculating the distance to fault the synchronization angle is determined in order to assure the common time reference for measurements from both line ends.

In Tziouvaras D. A., Roberts J., Benmmouyal G., ("New multi-ended fault location design for two- or three-terminal lines" CIGRE—Study Committee 34 Colloquium and Meeting, Preferential Subject 2—Fault Location and System Restoration, Paper 213, 11-15 Oct. 1999, Florence, Italy), and in Roberts J. B., Benmouyal G., Tziouvaras D. A., ("Multi-ended fault location system", U.S. Pat. No. 6,256,592 B1, Jul. 3, 2001) also complete two-terminal unsynchronized measurements are considered. The complete measurements are performed by digital relays installed at the terminals. However, in order to limit the amount of information which has to be sent via the communication channels, the following minimal information is sent by the remote relay:

magnitude value of the negative sequence current, magnitude and angle values of the negative sequence source impedance.

Thus, the approaches from above prior art documents are based on complete two-end measurements, while the present invention is using incomplete two-end measurements, i.e. currents from both ends but voltages only from one end. This type of measurements can be abbreviated with (2×V+1×I) according to the number of terminals where the voltages (V) or currents (I) are measured.

As concerns usage of incomplete two-end measurements such approaches have been considered in I. Zamora, J. F. Minambres, A. J. Mazon, R. Alvarez-Isasi and J. Lazaro, ("Fault location on two-terminal transmission lines based on voltages", IEE Proc. Gener. Transm. Distrib., vol. 143, pp. 1-6, No. 1, 1996), in Sukumar M. Brahma, Adly A. Girgis, ("Fault Location on a Transmission Line Using Synchronized Voltage Measurements", IEEE Transactions on Power Delivery, VOL. 19, No. 4, October 2004, pp. 1619-1622).

In these references a fault locator for two-terminal transmission lines was proposed which uses incomplete measurements since it uses only the synchronized voltages but not the currents of the two terminals (2×V).

Yet another limited application of measurements on two-terminal line has been considered in M. M. Sana, J. Izykowski and E. Rosolowski, (WO 03/044547 and "A two-end method of fault location immune to saturation of current transformers", Developments in Power System Protection Proceedings, Amsterdam, pp. 172-175, 2004), where the fault location method uses voltages from both ends and currents from only one terminal (2×V+I×I). The approach assures complete immunity of fault location to current transformer (CT) saturation, which basically can happen on one side of the line.

Thus, the incomplete measurements from above references, which are of the (2×V) or the (2×V+1×I) type, differ from the present invention, where the (2×I+1×V) type of measurements is applied.

A pure single-ended fault locator as described in L. Eriksson, M. M. Saha, G. D. Rockefeller, ("An accurate fault locator with compensation for apparent reactance in the fault resistance resulting from remote-end infeed", IEEE Trans. Power Apparatus and Systems, vol. PAS-104, No. 2, pp. 424-436, February 1985) and in Saha M. M., ("Method and device for locating a fault point on a three-phase power transmission line", U.S. Pat. No. 4,559,491, Dec. 17, 1985) determines the voltage drop across a fault path with considering the fault current distribution factors. However, the representative values of the source impedances are required to be known. In these documents the total fault current is estimated by use of the fault current distribution factors. In contrast, in the present invention the total fault current is not estimated but calculated from currents measured at both line terminals. Therefore, knowledge with respect to impedances of the sources is not required when calculating the distance to fault.

SUMMARY OF THE INVENTION

The object of the present invention is to create an improved, simple and reliable method and device for locating faults in a two-terminal power transmission or distribution line using synchronized measurements of the phase currents of the two terminals.

The object is achieved by a method and a device.

The fault location method according to the invention can be categorized as an impedance-based method. It uses as input signals the three phase currents from both line terminals and the three phase voltages only from one of the line terminals.

Additional input signals are transmission parameters of the line and the fault type. Based on these input signals the distance to fault is determined and output to an output interface.

Accordingly, the device for locating a fault, also called a fault locator, is equipped with a processing unit which processes according to the invention the three phase currents from both ends of the line, the three phase voltages from one of the line terminals, the transmission parameters of the line and the fault type to determine the distance to fault. The processing unit outputs the distance to fault to an output interface, from where the distance to fault can be transmitted to a display, a data memory unit or an external data network.

The provided current signals from both ends of the line are considered as being synchronized. In case this is not so, the synchronization angle can be determined using the known algorithms.

The main advantage of the invention is that since the phase voltages of only one end of the line are needed to determine the fault location, a device which is attached to one end of the line and which is, during normal working mode, provided with the currents from its own end, also called the local end or the local terminal, and with the currents from the other end of the line, that this device can now be enabled to determine the fault location even if a fault has occurred which allows no further data communication from the other end of the line. The method according to the invention requires only the possibility to receive the phase voltages from the local end.

In particular, the invention allows expanding the functionality of a current differential relay which is commonly placed at one end of a line for protection purposes. During normal working mode the current differential relay is provided with the phase currents from its local line terminal as well as from the other of the two line terminals. The current differential relay can now be supplemented with the off-line capability for precise location of a fault.

The fault location method according to the invention is categorized as an impedance-based method and it is formulated as an algorithm with using the phasors of symmetrical components of the measured quantities. In further derivations the parameters of the line as well as the phasors of the currents and voltages processed by the processing unit are considered as determined for the rated angular frequency: $\omega_1$, given in units of 1/s. The symmetrical components of all the processed signals are determined for the sequence of phases: a, b, c.

Two forms of the fault location algorithm are proposed. The first or basic version of the fault location algorithm applies the so called lumped model of the power line without taking into account the shunt parameters. As a result of using this model and the generalized fault loop model, a very simple first order equation for the distance to fault has been obtained. In order to provide the possibly highest accuracy for fault location, the optimal determination of the total fault current, i.e. the current flowing through a fault resistance, from the available measurements of two-end currents has been applied. To determine the total fault current, the positive, negative and zero sequence current components are multiplied by special coefficients, where the values of the coefficients depend on the current fault type. These coefficients are called share coefficients in the following.

The second or extended version of the fault location algorithm has been derived with the intention of improving the fault location accuracy in case of long lines, say of the length exceeding 150 km. For this purpose, the so called distributed parameter model of the line has been applied. Strict application of this model was applied when determining the voltage drop across the faulted line section and also for determining the voltage drop across the fault path resistance. Since the determined voltage drop across the fault resistance involves in this case the impedance or admittance parameters of the line, the values of the share coefficients differ from those used in the first version of the algorithm. Namely, the zero sequence components were eliminated in order to avoid adverse influence of uncertainty with respect to zero sequence data of the line. Apart from that, the second form of the fault location algorithm is of the form of a non-linear formula. Different to solving it with the use of well-known numerical methods, simple iterative calculations based on using simplified models of the faulted line, however, accounting for the distributed nature of the power line, have been proposed.

BRIEF DESCRIPTION OF THE DRAWINGS

For better understanding of the present invention, reference is made to the figures.

DETAILED DESCRIPTION OF EMBODIMENTS OF THE INVENTION

Figure 1:
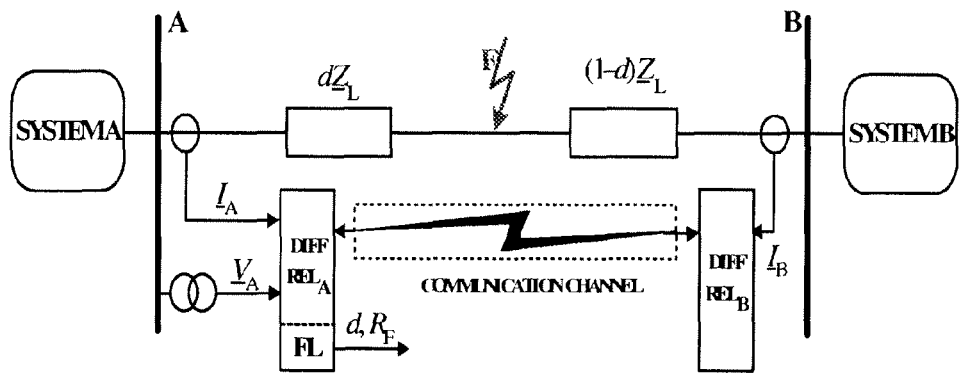
FIG. 1 illustrates a two-terminal transmission line comprising differential relays and a fault locator.

FIG. 1 illustrates the arrangement of a two-terminal line, which is considered as protected by current differential protective relays DIFF $REL_A$ and DIFF $REL_B$, which are installed at both line ends. The other types of protection for the line are not discussed here. The terminals of the line are denoted by A and B. The fault point is marked by F.

A fault locator FL is incorporated into the differential relay DIFF $REL_A$ of the substation A. This relay DIFF $REL_A$ is supplied with the local three-phase instantaneous currents, which after being digitalized are converted into the three phase current phasors $I_{A\_a}$, $I_{A\_b}$ and $I_{A\_c}$. Apart from that the relay DIFF $REL_A$ receives, via the communication channel, the three phase current phasors $I_{B\_a}$, $I_{B\_b}$ and $I_{B\_c}$ of the remote or other end of the line, substation B. The phasors are considered here as measured synchronously, which is required for performing the current differential protection of the line. In addition, the fault locator FL is supplied with the local three-phase voltages, which after being digitalized are converted into the three voltage phase phasors $V_{A\_a}$, $V_{A\_b}$ and $V_{A\_c}$. The voltage phasors $V_{A\_a}$, $V_{A\_b}$ and $V_{A\_c}$ are also considered as measured synchronously with the local current phasors $I_{A\_a}$, $I_{A\_b}$ and $I_{A\_c}$.

The fault locator and the fault location algorithm apply the following measurements of phasors:

$I_A$ stands for the three phase currents from the side A from particular phases a, b, c:

$I_{A\_a}$, $I_{A\_b}$, $I_{A\_c}$, $V_A$ stands for the three phase voltages from the side A from particular phases a, b, c:

$V_{A\_a}$, $V_{A\_b}$, $V_{A\_c}$ and $I_B$ stands for the three phase currents from the side B from particular phases a, b, c:

$I_{B\_a}$, $I_{B\_b}$, $I_{B\_c}$.

Besides the above listed input signals the fault location algorithm requires the following parameters:

transmission parameters of the line in form of impedance or admittance data of the line and the fault type, where the fault type can be provided from a protection unit or a dedicated classification procedure can be incorporated into the fault location method.

Fault Location Algorithm—Use of Lumped Parameter Model of the Line

Figure 2:
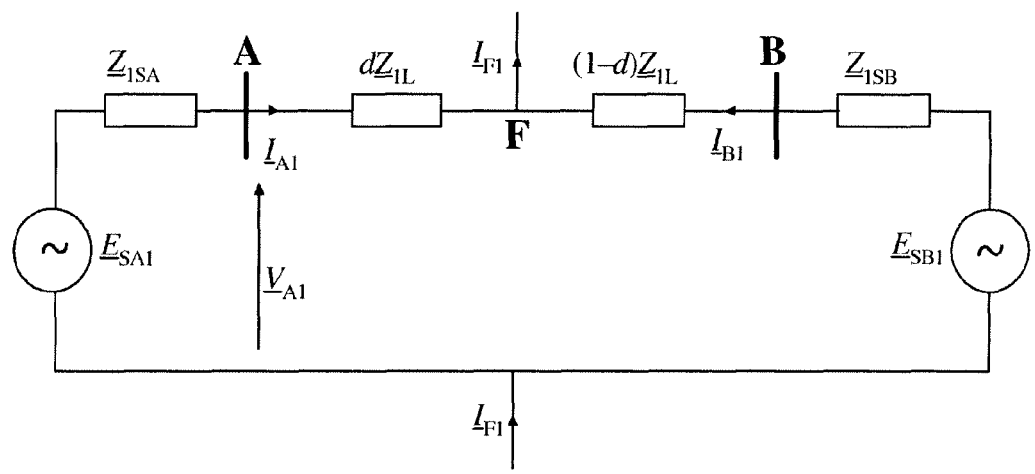
FIG. 2 illustrates an equivalent circuit diagram of the transmission line for the positive sequence.
Figure 3:
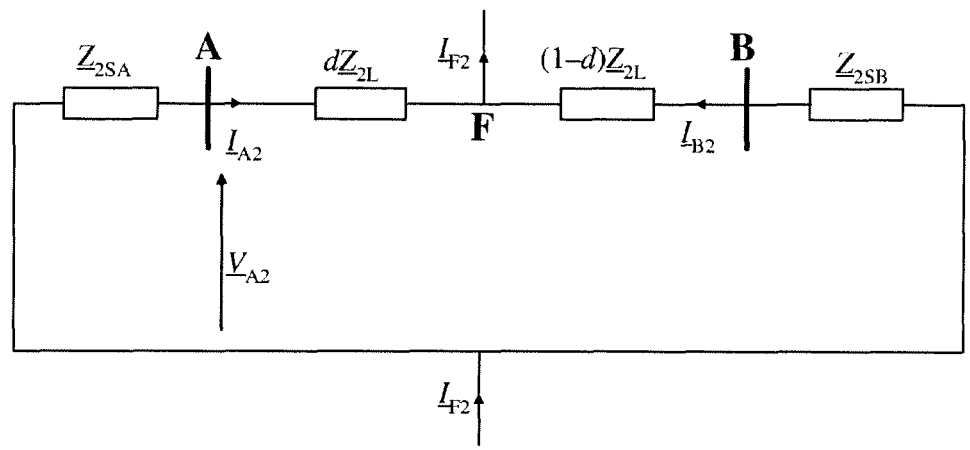
FIG. 3 illustrates an equivalent circuit diagram of the transmission line for the negative sequence.
Figure 4:
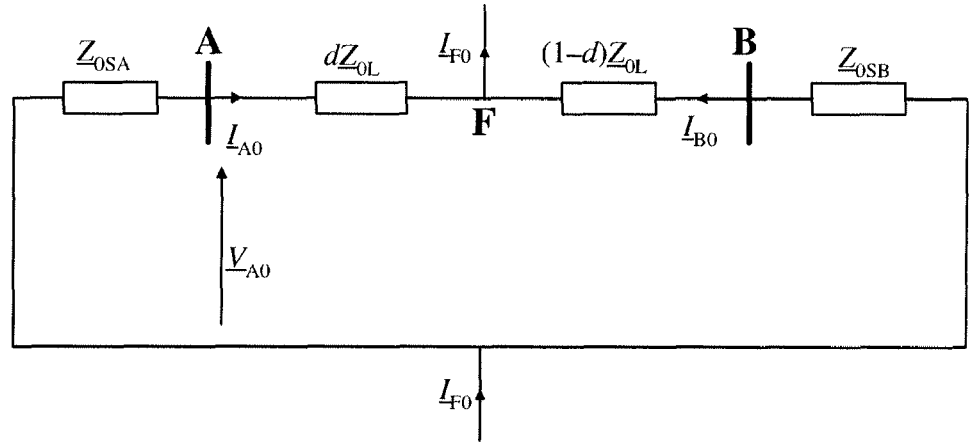
FIG. 4 illustrates an equivalent circuit diagram of the transmission line for the zero sequence.

The equivalent circuit diagram of the transmission line is disclosed for the positive sequence in FIG. 2, for the negative sequence in FIG. 3 and for the zero sequence in FIG. 4. At this stage of the derivation the distributed parameter character of the line is not taken into account and the shunt parameters of the line are neglected.

The generalized fault loop model is utilized for deriving the fault location procedure. This is a single formula with the coefficients dependent on a fault type, thus covering different fault types:

$$\underline{V}_{Ap} - d\underline{Z}_{1L}\underline{I}_{Ap} - R_F \underline{I}_F = 0 \qquad (1)$$

where:
d is the distance to fault F given in units of pu (per unit), counted from the terminal A,
$R_F$ is the fault resistance, $$\underline{V}_{Ap} = a_1 \underline{V}_{A1} + a_2 \underline{V}_{A2} + a_0 \underline{V}_{A0} \qquad (2)$$

is the fault loop voltage seen from terminal A, with the symmetrical voltage components $V_{A1}$, $V_{A2}$ and $V_{A0}$, where the subscript 1 stands for the positive, subscript 2 for the negative and subscript 0 for the zero sequence voltage components, respectively, (2)

$$\underline{I}_{Ap} = a_1 \underline{I}_{A1} + a_2 \underline{I}_{A2} + a_0 \frac{\underline{Z}_{0L}}{\underline{Z}_{1L}} \underline{I}_{A0} \qquad (3)$$

is the fault loop current seen from terminal A, with the symmetrical current components $I_{A1}$, $I_{A2}$ and $I_{A0}$, (3)

$a_1$, $a_2$, $a_0$ are weighting coefficients dependent on the fault type, outlined in Table 1, $\underline{Z}_{1L} = R_{1L} + jX_{1L}$ is the impedance of the whole line for the positive or the negative sequence, respectively, $\underline{Z}_{0L} = R_{0L} + jX_{0L}$ is the impedance of the whole line for the zero sequence and $I_F$ is the total fault current flowing through the fault resistance. The determination of the total fault current $I_F$ follows.

TABLE 1

Weighting coefficients for composing fault loop signals as defined in equations (2) and (3)

| FAULT | $a_1$ | $a_2$ | $a_0$ |
|---|---|---|---|
| a-g | 1 | 1 | 1 |
| b-g | $\underline{a}^2$ | $\underline{a}$ | 1 |
| c-g | $\underline{a}$ | $\underline{a}^2$ | 1 |
| a-b, a-b-g, a-b-c, a-b-c-g | $1 - \underline{a}^2$ | $1 - \underline{a}$ | 0 |
| b-c, b-c-g | $\underline{a}^2 - \underline{a}$ | $\underline{a} - \underline{a}^2$ | 0 |
| c-a, c-a-g | $\underline{a} - 1$ | $\underline{a}^2 - 1$ | 0 |

$\underline{a} = \exp(j2/3); j = \sqrt{-1}$

In equation (1) there are two unknowns: the distance to fault d and the fault resistance $R_F$. Resolving equation (1) into the real and imaginary parts yields:

$$\text{real}(\underline{V}_{Ap}) - d\,\text{real}(\underline{Z}_{1L}\underline{I}_{Ap}) - R_F \text{real}(\underline{I}_F) = 0 \qquad (4)$$

$$\text{imag}(\underline{V}_{Ap}) - d\,\text{imag}(\underline{Z}_{1L}\underline{I}_{Ap}) - R_F \text{imag}(\underline{I}_F) = 0 \qquad (5)$$

After elimination of the fault resistance $R_F$ one obtains the solution for the distance to fault d in the following form:

$$d = \frac{\text{real}(\underline{V}_{Ap})\text{imag}(\underline{I}_F) - \text{imag}(\underline{V}_{Ap})\text{real}(\underline{I}_F)}{\text{real}(\underline{Z}_{1L}\underline{I}_{Ap})\text{imag}(\underline{I}_F) - \text{imag}(\underline{Z}_{1L}\underline{I}_{Ap})\text{real}(\underline{I}_F)} \qquad (6)$$

Having determined the distance to fault d with equation (6) one can calculate the fault resistance $R_F$:

$$R_F = \frac{1}{2}\left(\frac{\text{real}(\underline{V}_{Ap})\text{imag}(\underline{I}_F) - d\,\text{real}(\underline{Z}_{1L}\underline{I}_{Ap})\text{imag}(\underline{I}_F)}{\text{real}(\underline{I}_F)\text{imag}(\underline{I}_F)} + \frac{\text{imag}(\underline{V}_{Ap})\text{real}(\underline{I}_F) - d\,\text{imag}(\underline{Z}_{1L}\underline{I}_{Ap})\text{real}(\underline{I}_F)}{\text{real}(\underline{I}_F)\text{imag}(\underline{I}_F)}\right) \qquad (7)$$

The terms $\text{real}(\underline{Z}_{1L}\underline{I}_{Ap})$ and $\text{imag}(\underline{Z}_{1L}\underline{I}_{Ap})$ from equation (6) can also be expressed as:

$$\text{real}(\underline{Z}_{1L}\underline{I}_{Ap}) = R_{1L}\text{real}(\underline{I}_{Ap}) - X_{1L}\text{imag}(\underline{I}_{Ap}) \qquad (8a)$$

$$\text{imag}(\underline{Z}_{1L}\underline{I}_{Ap}) = X_{1L}\text{real}(\underline{I}_{Ap}) + R_{1L}\text{imag}(\underline{I}_{Ap}) \qquad (8b)$$

where it was taken into account that the positive sequence impedance of the line equals:

$$\underline{Z}_{1L}=R_{1L}+jX_{1L}.$$

As a result of that, the equation (6) transforms to:

$$d = \frac{\text{real}(\underline{V}_{Ap})\text{imag}(\underline{I}_F) - \text{imag}(\underline{V}_{Ap})\text{real}(\underline{I}_F)}{\begin{array}{c}[R_{1L}\text{real}(\underline{I}_{Ap}) - X_{1L}\text{imag}(\underline{I}_{Ap})]\text{imag}(\underline{I}_F) - \\ [X_{1L}\text{real}(\underline{I}_{Ap}) + R_{1L}\text{imag}(\underline{I}_{Ap})]\text{real}(\underline{I}_F)\end{array}} \quad (9)$$

Determination of the Total Fault Current $\underline{I}_F$

It is proposed to utilize the generalized fault model in the form of the following equation for determining the total fault current $\underline{I}_F$:

$$\underline{I}_F = \underline{a}_{F1}\underline{I}_{F1} + \underline{a}_{F2}\underline{I}_{F2} + \underline{a}_{F0}\underline{I}_{F0} \quad (10)$$

where:

$\underline{I}_{F1}$, $\underline{I}_{F2}$, $\underline{I}_{F0}$ are symmetrical components of the total fault current, where the subscript 1 denotes the positive, subscript 2 denotes the negative and subscript 0 denotes the zero sequence, respectively), and $\underline{a}_{F1}$, $\underline{a}_{F2}$, $\underline{a}_{F0}$ are share coefficients, dependent on the fault type.

The particular sequence components $\underline{I}_{F1}$, $\underline{I}_{F2}$ and $\underline{I}_{F0}$ of the total fault current $\underline{I}_F$ are determined by the sum of the respective sequence components of currents from the line terminals A and B. At the right-hand side of the equations given below the first subscript, A or B, denotes the terminal, while the second subscript 1, 2 or 0 denotes again the respective sequence component:

$$\underline{I}_{F1} = \underline{I}_{A1} + \underline{I}_{B1} \quad (11)$$

$$\underline{I}_{F2} = \underline{I}_{A2} + \underline{I}_{B2} \quad (12)$$

$$\underline{I}_{F0} = \underline{I}_{A0} + \underline{I}_{B0} \quad (13)$$

Alternatively, the positive sequence component $\underline{I}_{F1}$ of the total fault current $\underline{I}_F$ can be determined with the use of the superimposed incremental positive sequence currents $\Delta\underline{I}_{A1}$ and $\Delta\underline{I}_{B1}$, where incremental means the difference between the corresponding post-fault and pre-fault values:

$$\underline{I}_{F1} = \Delta\underline{I}_{A1} + \Delta\underline{I}_{B1} \quad (14)$$

It is known that the use of the positive sequence currents from the line terminals according to equation (11), $\underline{I}_{A1}$ and $\underline{I}_{B1}$, for determining the total fault current $\underline{I}_F$ according to equation (10) is affected by the pre-fault load flow. Therefore, in such cases where the positive sequence currents are used, the fault location accuracy is deteriorated, especially significantly if a high fault resistance is involved. In contrast, the use of the negative and zero sequence components and of the superimposed positive sequence components is advantageous for assuring high accuracy of the fault location.

Fault Location Algorithm—Use of Distributed Parameter Model of the Line

The Transmission Parameters of the Line

Further, it is taken into account that in real life transmission lines the positive and negative sequence parameters are identical. Impedances for the positive and negative sequences in the considered circuit diagrams are distinguished by different subscripts, 1 for the positive sequence and 2 for the negative sequence, even though they are of identical values.

In the further considerations, the following transmission parameters of the transmission line are utilized: $\underline{\gamma}_1 = \sqrt{\underline{Z}'_{1L}\underline{Y}'_{1L}}$ is the propagation constant of the line for the positive sequence, $\underline{\gamma}_2 = \underline{\gamma}_1$ is the propagation constant of the line for the negative sequence, $\underline{\gamma}_0 = \sqrt{\underline{Z}'_{0L}\underline{Y}'_{0L}}$ is the propagation constant of the line for the zero sequence, $\underline{Z}_{c1} = \sqrt{\underline{Z}'_{1L}/\underline{Y}'_{1L}}$ is the characteristic impedance of the line for the positive sequence, $\underline{Z}_{c2} = \underline{Z}_{c1}$ is the characteristic impedance of the line for the negative sequence, $\underline{Z}_{c0} = \sqrt{\underline{Z}'_{0L}/\underline{Y}'_{0L}}$ is the characteristic impedance of the line for the zero sequence, $\underline{Z}'_{1L} = R'_{1L} + j\omega_1 L'_{1L}$ is the impedance of the line for the positive sequence given in units of /km, $\underline{Z}'_{2L} = \underline{Z}'_{1L}$ is the impedance of the line for the negative sequence given in units of /km, $\underline{Y}'_{1L} = G'_{1L} + j\omega_1 C'_{1L}$ is the admittance of the line for the positive sequence given in units of S/km, $\underline{Y}'_{2L} = \underline{Y}'_{1L}$ is the admittance of the line for the negative sequence given in units of S/km, $R'_{1L}$, $L'_{1L}$, $G'_{1L}$, $C'_{1L}$ are the resistance, inductance, conductance and capacitance of the line for the positive or negative sequence per km line length, respectively, $\underline{Z}'_{0L} = R'_{0L} + j\omega_1 L'_{0L}$ is the impedance of the line for the zero sequence given in units of /km, $\underline{Y}'_{0L} = G'_{0L} + j\omega_1 C'_{0L}$ is the admittance of the line for the zero sequence given in units of S/km, $R'_{0L}$, $L'_{0L}$, $G'_{0L}$, $C'_{0L}$ are resistance, inductance, conductance and capacitance of the line for the zero sequence per km line length, respectively, l is the length of the line given in units of km $\underline{Z}_{1L} = \underline{Z}'_{1L}l$ is the impedance of the line for the positive sequence given in units of, $\underline{Z}_{2L} = \underline{Z}_{1L}$ is the impedance of the line for the negative sequence given in units of and $\underline{Z}_{0L} = \underline{Z}'_{0L}l$ is the impedance of the line for the zero sequence given in units of.

Figure 5:
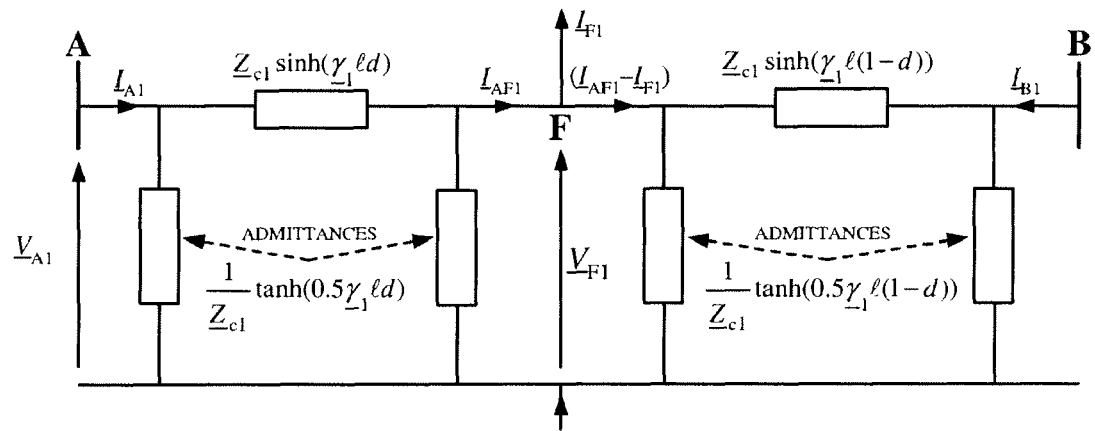
FIG. 5 illustrates a distributed parameter model of the transmission line for the positive sequence.
Figure 6:
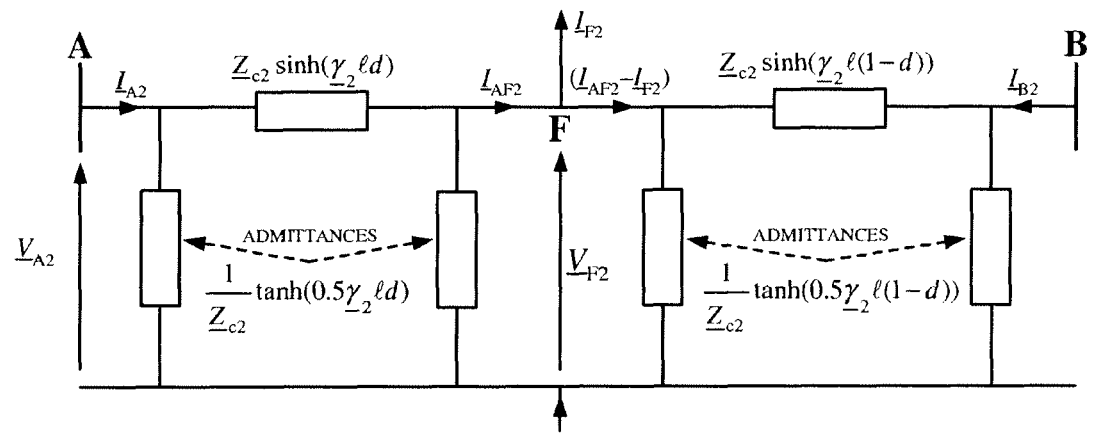
FIG. 6 illustrates a distributed parameter model of the transmission line for the negative sequence.
Figure 7:
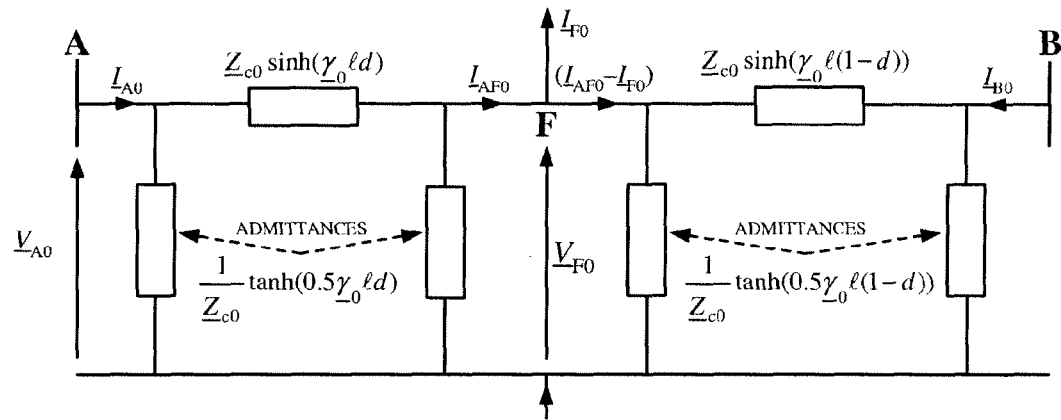
FIG. 7 illustrates a distributed parameter model of the transmission line for the zero sequence.

FIGS. 5-7 illustrate the distributed parameter models of the faulted transmission line for the respective sequences.

Formulation of the Fault Location Algorithm with Taking into Account the Distributed Parameter Line Model The distance to fault d according to equations (6) or (9) is determined under neglecting the shunt capacitances of the transmission line. In case of short lines, say up to 150 km, equations (6) and (9) are sufficient for achieving high accuracy of fault location. However, for longer lines the distributed parameter nature of the line has to be taken into account and the effect of the shunt capacitances has to be compensated for. The derivation of an according algorithm follows.

Again, the generalized fault loop model is applied for determining the distance to fault. In the considered case, the generalized model describing the fault loop seen from the terminal A is formulated as follows:

$$\underline{V}_{Fp}(d) - R_F \underline{I}_F = 0 \quad (15)$$

where:

d is the unknown distance to fault given in units of pu (per unit), as seen from the terminal A, $R_F$ is the unknown fault path resistance, $\underline{V}_{Fp}(d)$ is the fault loop voltage, composed according to the fault type, after analytic transfer from the terminal A to the fault point F, $\underline{I}_F$ is the fault path current or total fault current.

The transferred fault loop voltage $\underline{V}_{Fp}(d)$ from equation (15) is composed as follows:

$$\underline{V}_{Fp}(d) = \underline{a}_1 \underline{V}_{F1} + \underline{a}_2 \underline{V}_{F2} + \underline{a}_0 \underline{V}_{F0} \tag{16}$$

where:

$\underline{a}_1, \underline{a}_2, \underline{a}_0$ are weighting coefficients dependent on the fault type, as outlined in Table 1.

Applying the distributed parameter model of the line, the symmetrical components of the voltages $V_{F1}, V_{F2}$ and $V_{F0}$ from equation (16) are determined as follows:

$$\underline{V}_{F1} = \underline{V}_{A1} \cos h(\underline{\gamma}_1 ld) - \underline{Z}_{c1} \underline{I}_{A1} \sin h(\underline{\gamma}_1 ld) \tag{17}$$

$$\underline{V}_{F2} = \underline{V}_{A2} \cos h(\underline{\gamma}_2 ld) - \underline{Z}_{c2} \underline{I}_{A2} \sin h(\underline{\gamma}_2 ld) \tag{18}$$

$$\underline{V}_{F0} = \underline{V}_{A0} \cos h(\underline{\gamma}_0 ld) - \underline{Z}_{c0} \underline{I}_{A0} \sin h(\underline{\gamma}_0 ld) \tag{19}$$

where:

$\underline{V}_{A1}, \underline{V}_{A2}, \underline{V}_{A0}$ are the symmetrical components of side A voltages, with the subscript 1 denoting the positive sequence component, subscript 2 the negative sequence component and subscript 0 the zero sequence component, and $\underline{I}_{A1}, \underline{I}_{A2}, \underline{I}_{A0}$ are the symmetrical components of side A currents.

The other parameters used in equations (17)-(19) are defined above.

In order to solve equation (15), the total fault current $\underline{I}_F$ is needed.

Determination of the Total Fault Current $\underline{I}_F$

The derivation of the positive sequence $\underline{I}_{F1}$ of the total fault current $\underline{I}_F$ is presented below.

According to the distributed parameter model of the line for the positive sequence, FIG. 5, one obtains after considering the faulted line section from terminal A to fault F:

$$\underline{V}_{F1} = \underline{V}_{A1} \cos h(\underline{\gamma}_1 ld) - \underline{Z}_{c1} \underline{I}_{A1} \sin h(\underline{\gamma}_1 ld) \tag{20}$$

$$\underline{I}_{AF1} = -(1/\underline{Z}_{c1}) V_{A1} \sin h(\underline{\gamma}_1 ld) + \underline{I}_{A1} \cos h(\underline{\gamma}_1 ld) \tag{21}$$

Considering the other line section between fault F and terminal B, one obtains the following equation for the positive sequence of the remote current:

$$\underline{I}_{B1} = (1/\underline{Z}_{c1}) \underline{V}_{F1} \sin h(\underline{\gamma}_1 l(1-d)) - (\underline{I}_{AF1} - \underline{I}_{F1}) \cos h(\underline{\gamma}_1 l(1-d)) \tag{22}$$

From equation (22) results that the positive sequence $\underline{I}_{F1}$ of the total fault current $\underline{I}_F$ is expressed as:

$$I_{F1} = \frac{M_1}{\cosh(\underline{\gamma}_1 \ell(1-d))} \tag{A1}$$

where:

$\underline{M}_1 = \underline{I}_{B1} - (1/\underline{Z}_{c1}) \sin h(\underline{\gamma}_1 l(1-d)) \underline{V}_{F1} + \cos h(\underline{\gamma}_1 l(1-d))$
$\underline{I}_{AF1}$ (A2).

Substituting $\underline{V}_{F1}$ by equation (20) and $\underline{I}_{AF1}$ by equation (21), it is obtained:

$\underline{M}_1 = \underline{I}_{B1} - (1/\underline{Z}_{c1}) \sin h(\underline{\gamma}_1 l(1-d))[\underline{V}_{A1} \cos h(\underline{\gamma}_1 ld) - \underline{Z}_{c1} \underline{I}_{A1}$
$\sin h(\underline{\gamma}_1 ld)] + \cos h(\underline{\gamma}_1 l(1-d))[-(1/\underline{Z}_{c1}) \underline{V}_{A1} \sin$
$h(\underline{\gamma}_1 ld) + \underline{I}_{A1} \cos h(\underline{\gamma}_1 ld)]$ (A3).

Rearranging equation (A3) results in:

$\underline{M}_1 = \underline{I}_{B1} - (1/\underline{Z}_{c1}) \sin h(\underline{\gamma}_1 l(1-d)) \cos h(\underline{\gamma}_1 ld) \underline{V}_{A1} \sin$
$h(\underline{\gamma}_1 l(1-d)) \sin h(\underline{\gamma}_1 ld) \underline{I}_{A1} - (1/\underline{Z}_{c1}) \cos$
$h(\underline{\gamma}_1 l(1-d)) \sin h(\underline{\gamma}_1 ld) \underline{V}_{A1} + \cos h(\underline{\gamma}_1 l(1-d)) \cos$
$h(\underline{\gamma}_1 ld) \underline{I}_{A1}$ (A4)

In general, hyperbolic functions can be expressed as:

$$\sin h(x+y) = \sin h(x) \cos h(y) + \sin h(x) \cos h(y) \tag{A5}$$

$$\cos h(x+y) = \sin h(x) \sin h(y) + \cos h(x) \cos h(y) \tag{A6}$$

Applying equations (A5)-(A6) for shortening of equation (A4) the following equation for the positive sequence $\underline{I}_{F1}$ of the total fault current $\underline{I}_F$ is obtained:

$$I_{F1} = \frac{M_1}{\cosh(\underline{\gamma}_1 \ell(1-d))} \tag{23}$$

where:

$$\underline{M}_1 = I_{A1} \cosh(\underline{\gamma}_1 \ell) + I_{B1} - \frac{1}{\underline{Z}_{c1}} \underline{V}_{A1} \sinh(\underline{\gamma}_1 \ell). \tag{24}$$

It is worth to notice that equations (23)-(24) can be linearized by taking into account that:

$$\cos h(x) \to 1 \tag{A7}$$

$$\sin h(x) \to x \tag{A8}$$

where:

$x = \underline{\gamma}_1 l$ or $x = \underline{\gamma}_1 l(1-d)$ according to FIG. 5.

Applying equations (A7)-(A8) to equations (23)-(24) results in obtaining the linearized equation for the positive sequence $\underline{I}_{F1}$ of the total fault current $\underline{I}_F$:

$$\underline{I}_{F1} = \underline{I}_{A1} + \underline{I}_{B1} - \underline{Y}'_{1L} l \underline{V}_{A1} \tag{A9}$$

The linearized equation (A9) can be utilized for starting iterative calculations of the distance to fault d.

Substituting equations (20)-(21) into equation (22) and after manipulations on hyperbolic functions as described above, the following equation is obtained for the positive sequence $\underline{I}_{F1}$ of the total fault current $\underline{I}_F$:

$$I_{F1} = \frac{M_1}{\cosh(\underline{\gamma}_1 \ell(1-d))} \tag{23}$$

where:

$$\underline{M}_1 = I_{A1} \cosh(\underline{\gamma}_1 \ell) + I_{B1} - \frac{1}{\underline{Z}_{c1}} \underline{V}_{A1} \sinh(\underline{\gamma}_1 \ell). \tag{24}$$

Analogously, for the negative sequence $\underline{I}_{F2}$ of the total fault current $\underline{I}_F$ it is obtained:

$$I_{F2} = \frac{M_2}{\cosh(\underline{\gamma}_2 \ell(1-d))} \tag{25}$$

where:

$$\underline{M}_2 = I_{A2} \cosh(\underline{\gamma}_2 \ell) + I_{B2} - \frac{1}{\underline{Z}_{c2}} \underline{V}_{A2} \sinh(\underline{\gamma}_2 \ell). \tag{26}$$

For the zero sequence $\underline{I}_{F0}$ of the total fault current $\underline{I}_F$ it is obtained:

$$I_{F0} = \frac{M_0}{\cosh(\underline{\gamma}_0 \ell(1-d))} \tag{27}$$

where:

$$\underline{M}_0 = I_{A0} \cosh(\underline{\gamma}_0 \ell) + I_{B0} - \frac{1}{\underline{Z}_{c0}} \underline{V}_{A0} \sinh(\underline{\gamma}_0 \ell). \tag{28}$$

Utilizing the generalized fault model in the form of the equation (15) requires selecting the share coefficients $\underline{a}_{F1}$, $\underline{a}_{F2}$ and $\underline{a}_{F0}$. In the case when the fault location algorithm takes into account the distributed parameter model of the line, the selection of the share coefficients differs from the case when the fault location algorithm takes into account the lumped model of the transmission line. This is so, because in the case of the distributed parameter model the sequence components of the total fault current according to equations (23)-(28) are dependent on the parameters of the transmission line $\gamma_i$ and $Z_{ci}$, where the subscript $i=1$, 2 or 0 denotes the type of the symmetrical component. Namely, for the zero sequence component $I_{F0}$ of the total fault current $I_F$, the parameters of the line for the zero sequence $\gamma_0$ and $Z_{c0}$ are involved in equations (27)-(28) and it is worth to realize that these parameters are considered to be to some extent uncertain parameters. Therefore it is advantageous to explore the freedom in selecting the share coefficients in such a way that the zero sequence is excluded, i.e. the corresponding share coefficient is chosen to be equal to zero: $a_{F0}=0$. In all further considerations exclusion of the zero sequence components is applied. As a result, the total fault current $I_F$ is now determined as:

$$I_F = a_{F1}I_{F1} + a_{F2}I_{F2} \tag{29}$$

There are two characteristic sets, among others possible, of the share coefficients for the phase-to-ground and phase-to-phase faults, as outlined in Table 2.

TABLE 2

Two alternative sets of share coefficients for phase-to-ground faults and phase-to-phase faults

| FAULT | I-SET $a_{F1}^{I\text{-}SET}$ | I-SET $a_{F2}^{I\text{-}SET}$ | II-SET $a_{F1}^{II\text{-}SET}$ | II-SET $a_{F2}^{II\text{-}SET}$ |
|---|---|---|---|---|
| a-g | 0 | 3 | 3 | 0 |
| b-g | 0 | $3\underline{a}$ | $3\underline{a}^2$ | 0 |
| c-g | 0 | $3\underline{a}^2$ | $3\underline{a}$ | 0 |
| a-b | 0 | $1-\underline{a}$ | $1-\underline{a}^2$ | 0 |
| b-c | 0 | $\underline{a}-\underline{a}^2$ | $\underline{a}^2-\underline{a}$ | 0 |
| c-a | 0 | $\underline{a}^2-1$ | $\underline{a}-1$ | 0 |

In contrast to the above fault types, another situation arises for the remaining fault types, phase-to-phase-to-ground and three phase symmetrical faults. This is so, since for these remaining faults there is no alternative sets of the share coefficients for the positive and the negative sequence—see Table 3.

TABLE 3

Set of share coefficients for phase-to-phase-to-ground faults and three phase faults.

| FAULT | $a_{F1}$ | $a_{F2}$ |
|---|---|---|
| a-b-g, a-b-c, a-b-c-g | $1-\underline{a}^2$ | $1-\underline{a}$ |
| b-c-g | $\underline{a}^2-\underline{a}$ | $\underline{a}-\underline{a}^2$ |
| c-a-g | $\underline{a}-1$ | $\underline{a}^2-1$ |

The fault loop voltage $V_{Fp}(d)$, which is composed according to the fault type of Table 1 and analytically transferred from the terminal A to the fault point F, can be rewritten, starting from the generalized fault loop model (15) and taking into account equations (16)-(19):

$$\underline{V}_{Fp}(d) = \sum_{i=0}^{2} a_i \left( \underline{V}_{Ai}\cosh(\underline{\gamma}_i \ell d) - Z_{ci}\underline{I}_{Ai}\sinh(\underline{\gamma}_i \ell d) \right) \tag{30}$$

Taking into account that the zero sequence component $I_{F0}$ of the total fault current $I_F$ is excluded according to equation (29), the generalized fault loop model (15) can be rewritten as follows:

$$\sum_{i=0}^{2} a_i \left( \underline{V}_{Ai}\cosh(\underline{\gamma}_i \ell d) - Z_{ci}\underline{I}_{Ai}\sinh(\underline{\gamma}_i \ell d) \right) - \tag{31}$$

$$R_F \sum_{i=1}^{2} \frac{a_{Fi}M_i}{\cosh(\underline{\gamma}_i \ell(1-d))} = 0$$

Figure 8:
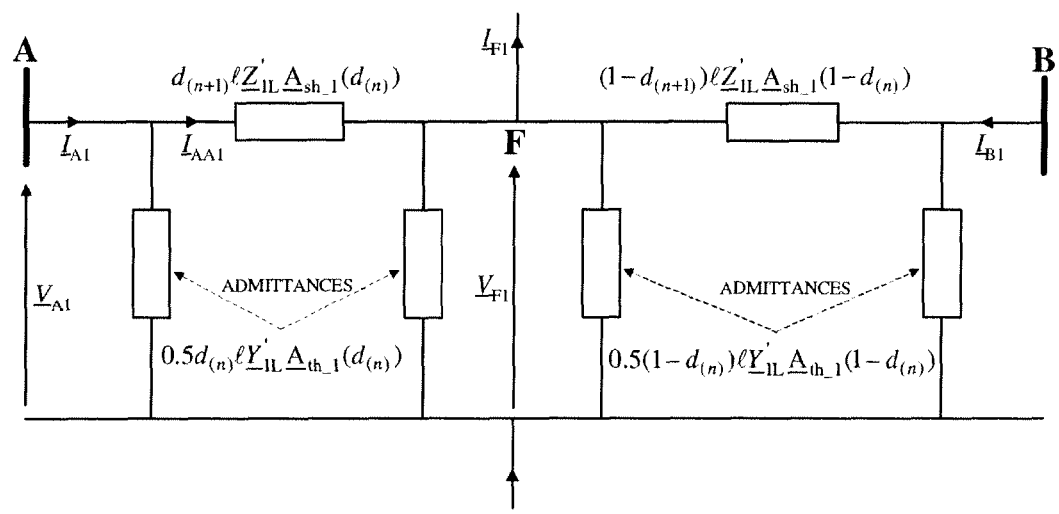
FIG. 8 illustrates a simplified distributed parameter model of the transmission line for the positive sequence.
Figure 9:
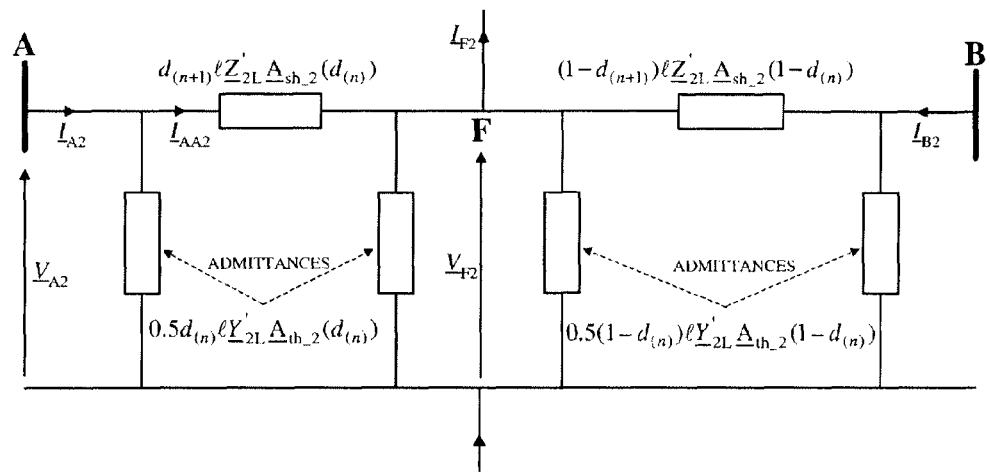
FIG. 9 illustrates a simplified distributed parameter model of the transmission line for the negative sequence.
Figure 10:
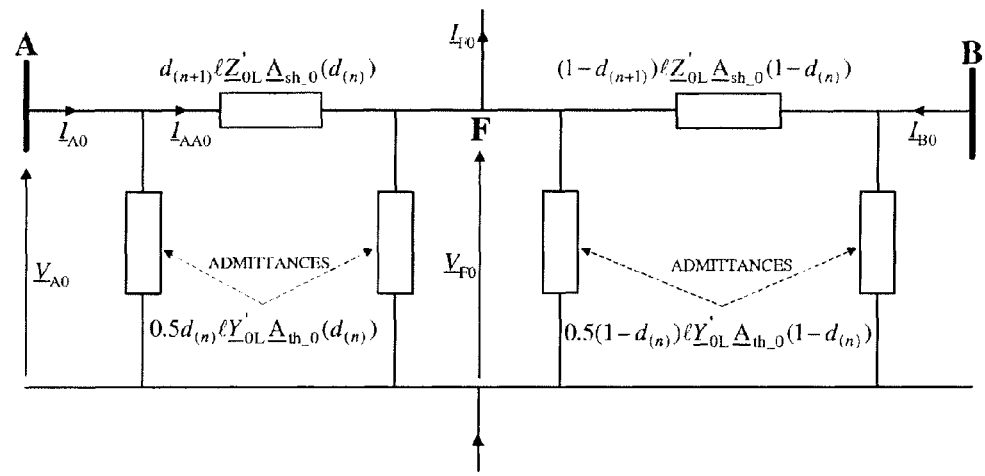
FIG. 10 illustrates a simplified distributed parameter model of the transmission line for the zero sequence.
Figure 11:
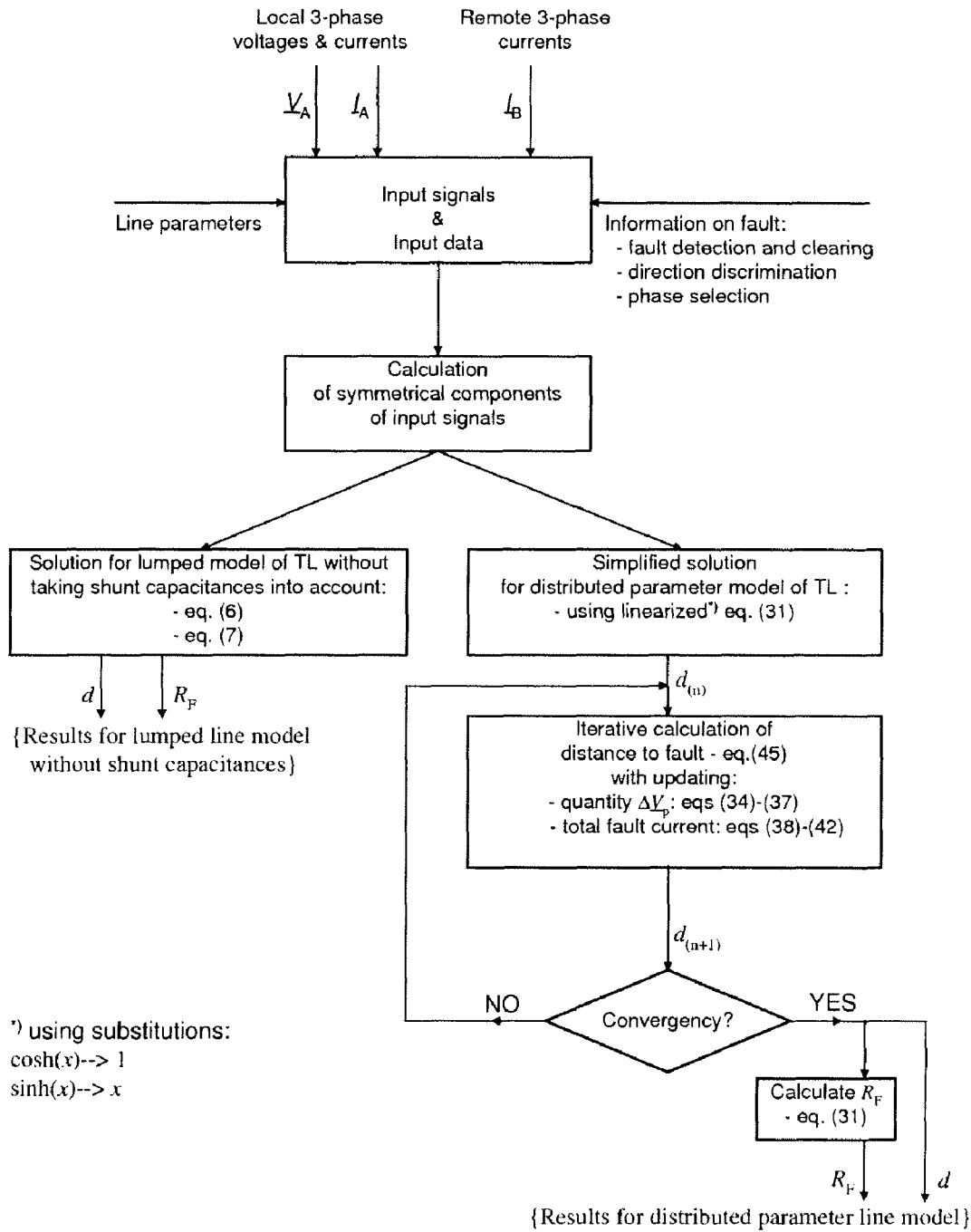
FIG. 11 illustrates a flow chart of the steps of a method for locating a fault on the transmission line.

The obtained generalized fault loop model (31) can be solved by using numerical methods for solving a set of non-linear equations. In this case there are two unknowns which are the distance to fault d and the fault resistance $R_F$. For example, the Newton-Raphson method can be applied for that. However, in order to make the calculations somehow simpler it is proposed to use the simplified models of the faulted transmission line as can be seen in FIGS. 8-10. Using these models, results in simple calculations for determining the distance to fault d.

According to the simplified models from FIGS. 8-10 the following generalized fault loop model, seen from the terminal A, can be formulated:

$$\underline{V}_{Ap} - d_{(n+1)}\Delta \underline{V}_p(d_{(n)}) - R_F \underline{I}_F(d_{(n)}) = 0 \tag{32}$$

where:
n denotes the previous iteration step,
n+1 denotes the current iteration step,
$d_{(n+1)}$ is the value of the distance to fault obtained as the result of performing the current iteration step,
$d_{(n)}$ is the value of the distance to fault obtained in the previous iteration step, which when starting the iterative calculations is obtained from the fault location algorithm for the lumped model of the transmission line according to equation (6) or (9).

The fault loop voltage $V_{Ap}$ from equation (32) is composed of symmetrical components $V_{A1}$, $V_{A2}$ and $V_{A3}$, with using the weighting coefficients outlined in Table 1:

$$\underline{V}_{Ap} = a_1 \underline{V}_{A1} + a_2 \underline{V}_{A2} + a_0 \underline{V}_{A0} \tag{33}$$

The voltage drop $d_{(n+1)}\Delta V_p(d_{(n)})$ across the faulted line section between terminal A and fault F, derived from the generalized fault loop model (32), involves the distance to fault $d_{(n+1)}$ of the current iteration step and the fault loop quantity $\Delta V_p$.

The quantity $\Delta V_p$ is determined with a simplification, namely with taking into account the impedance and admittance parameters of the faulted line section between terminal A and fault F, considered as being of the length equal to the value of the previous value of the distance to fault $d_{(n)}$:

$$\Delta \underline{V}_p = a_1 l \underline{Z}'_{1L} \underline{A}_{sh\_1}(d_{(n)})\underline{I}_{AA1} + a_2 l \underline{Z}'_{2L} \underline{A}_{sh\_2}(d_{(n)})\underline{I}_{AA2} + a_0 l \underline{Z}_{0L} \underline{A}_{sh\_0}(d_{(n)})\underline{I}_{AA0} \tag{34}$$

The symmetrical components of the currents $\underline{I}_{AA1}$, $\underline{I}_{AA2}$ and $\underline{I}_{AA0}$ (see FIGS. 8-10) are used for calculation of the fault loop quantity $\Delta V_p$ according to equation (34). The currents $\underline{I}_{AA1}$, $\underline{I}_{AA2}$ and $\underline{I}_{AA0}$ are obtained by deducing the respective shunt currents:

$$I_{AA1} = I_{A1} - 0.5 d_{(n)} \ell \underline{Y}'_{1L} \underline{A}_{th\_1}(d_{(n)}) \cdot \underline{V}_{A1} \quad (35)$$

$$I_{AA2} = I_{A2} - 0.5 d_{(n)} \ell \underline{Y}'_{2L} \underline{A}_{th\_2}(d_{(n)}) \cdot \underline{V}_{A2} \quad (36)$$

$$I_{AA0} = I_{A0} - 0.5 d_{(n)} \ell \underline{Y}'_{0L} \underline{A}_{th\_0}(d_{(n)}) \cdot \underline{V}_{A0} \quad (37)$$

where:

$$\underline{A}_{sh\_1}(x) = \frac{\sinh(\underline{\gamma}_1 \ell d_{(n)})}{\underline{\gamma}_1 \ell d_{(n)}},$$

$$\underline{A}_{sh\_2}(x) = \frac{\sinh(\underline{\gamma}_2 \ell d_{(n)})}{\underline{\gamma}_2 \ell d_{(n)}},$$

$$\underline{A}_{sh\_0}(x) = \frac{\sinh(\underline{\gamma}_0 \ell d_{(n)})}{\underline{\gamma}_0 \ell d_{(n)}},$$

$$\underline{A}_{th\_1}(x) = \frac{\tanh(0.5 \underline{\gamma}_1 \ell d_{(n)})}{0.5 \underline{\gamma}_1 \ell d_{(n)}},$$

$$\underline{A}_{th\_2}(x) = \frac{\tanh(0.5 \underline{\gamma}_2 \ell d_{(n)})}{0.5 \underline{\gamma}_2 \ell d_{(n)}} \text{ and}$$

$$\underline{A}_{th\_0}(x) = \frac{\tanh(0.5 \underline{\gamma}_0 \ell d_{(n)})}{0.5 \underline{\gamma}_0 \ell d_{(n)}}.$$

The total fault current $\underline{I}_F$, after taking into account that the zero sequence component is excluded, can be expressed as follows:

$$\underline{I}_F(d_{(n)}) = \underline{a}_{F1} \underline{I}_{F1}(d_{(n)}) + \underline{a}_{F2} \underline{I}_{F2}(d_{(n)}) \quad (38),$$

with the positive sequence $\underline{I}_{F1}$ of the total fault current $\underline{I}_F$:

$$\underline{I}_{F1}(d_{(n)}) = \frac{\underline{M}_1}{\cosh(\underline{\gamma}_1 \ell (1 - d_{(n)}))} \quad (39)$$

where:

$$\underline{M}_1 = \underline{I}_{A1} \cosh(\underline{\gamma}_1 \ell) + \underline{I}_{B1} - \frac{1}{\underline{Z}_{c1}} \underline{V}_{A1} \sinh(\underline{\gamma}_1 \ell), \quad (40)$$

and with the negative sequence $\underline{I}_{F2}$ of the total fault current $\underline{I}_F$:

$$\underline{I}_{F2}(d_{(n)}) = \frac{\underline{M}_2}{\cosh(\underline{\gamma}_2 \ell (1 - d_{(n)}))} \quad (41)$$

where:

$$\underline{M}_2 = \underline{I}_{A2} \cosh(\underline{\gamma}_2 \ell) + \underline{I}_{B2} - \frac{1}{\underline{Z}_{c2}} \underline{V}_{A2} \sinh(\underline{\gamma}_2 \ell). \quad (42)$$

The equation (32) with the two unknowns $d_{(n+1)}$ and $R_F$ can be solved by resolving it into the real and imaginary parts:

$$\mathrm{real}(\underline{V}_{Ap}) - d_{(n+1)} \mathrm{real}(\Delta \underline{V}_p(d_{(n)})) - R_F \mathrm{real}(\underline{I}_F(d_{(n)})) = 0 \quad (43)$$

$$\mathrm{imag}(\underline{V}_{Ap}) - d_{(n+1)} \mathrm{imag}(\Delta \underline{V}_p(d_{(n)})) - R_F \mathrm{imag}(\underline{I}_F(d_{(n)})) = 0 \quad (44)$$

By eliminating the fault resistance $R_F$, one obtains the equation for the distance to fault $d_{(n+1)}$ of the current iteration step:

$$d_{(n+1)} = \frac{\mathrm{real}(\underline{V}_{Ap}) \cdot \mathrm{imag}(\underline{I}_F(d_{(n)})) - \mathrm{imag}(\underline{V}_{Ap}) \cdot \mathrm{real}(\underline{I}_F(d_{(n)}))}{\mathrm{real}(\Delta \underline{V}_p(d_{(n)})) \cdot \mathrm{imag}(\underline{I}_F(d_{(n)})) - \mathrm{imag}(\Delta \underline{V}_p(d_{(n)})) \cdot \mathrm{real}(\underline{I}_F(d_{(n)}))} \quad (45)$$

Iterative calculations have to be performed for a pre-defined number of iteration steps or until the pre-defined convergence is achieved, i.e. until the difference between the value of the distance to fault of the current iteration step $d_{(n+1)}$ and the value of the distance to fault of the previous iteration step $d_n$ less than a pre-defined threshold value. However, in practice performing a single iteration only is usually sufficient.

Having determined the distance to fault according to equation (45) one can calculate the fault resistance $R_F$ from equations (43)-(44), analogously as in the case of the lumped model of the line according to equation (7).

The method to determine the distance to fault outlined above is especially suitable to be incorporated as an added feature into a current differential relay. When the current differential relay is applied to protect a two-terminal line, it utilizes the phase currents measured synchronously at both line terminals for the protection purposes. Therefore, in order to incorporate the fault location function additionally to the protection function itself, the local phase voltages, i.e. the phase voltages from the terminal where the differential relay is installed, which is presumed to be the terminal A in the further considerations, have to be supplied to the relay. In this way the differential relay equipped with the fault location feature can identify the fault not only in terms whether it occurred within the zone or outside it, which is already part of the known differential relay principle, but also more precisely in terms of determining the exact distance from the local line terminal. This additional feature of the current differential relay can for example be used to support and simplify inspection and repair of a faulty transmission or distribution line.

The invention claimed is:

1. A method for locating a fault in a two-terminal power transmission or distribution line, the method comprising:
    receiving measurements of three phase currents from each of the two terminals,
    receiving measurements of three phase voltages from one of the two terminals,
    receiving transmission parameters of the distribution line,
    receiving the fault type,
    determining the symmetrical current and voltage components corresponding to the phase currents and phase voltages,
    determining a fault loop voltage seen from the one of the two terminals based on the corresponding symmetrical voltage components and on the fault type,
    determining a fault loop current seen from the one of the two terminals based on the symmetrical current components of the one of the two terminals, on the transmission parameters and on the fault type,
    determining a total fault current based on the symmetrical current components and on the fault type,
    determining the distance to fault seen from the one of the two terminals based on the fault loop voltage on the fault loop current and on the total fault current, and
    outputting the distance to fault to an output interface.

2. The method according to claim 1, wherein the distance to fault is determined according to $$d = \frac{real(\underline{V}_{Ap})imag(\underline{I}_F) - imag(\underline{V}_{Ap})real(\underline{I}_F)}{real(\underline{Z}_{1L}\underline{I}_{Ap})imag(\underline{I}_F) - imag(\underline{Z}_{1L}\underline{I}_{Ap})real(\underline{I}_F)}.$$

3. The method according to claim 1, further comprising:
an iteration which starts from the distance to fault and outputs the distance to fault determined in the last iteration step after a predefined number of iteration steps are reached or after a predefined convergence of the distance to fault is achieved, where each iteration comprising:
determining a fault loop quantity qualifying the voltage drop between the one of the two terminals and the fault based on the symmetrical current and voltage components of the one of the two terminals, on the transmission parameters, on the fault type and on a former distance to fault determined in a former iteration,
determining an iterative total fault current based on the symmetrical current and voltage components, on the transmission parameters, on the fault type and on a former distance to fault determined in a former iteration, and
determining the distance to fault based on the fault loop voltage, on the fault loop quantity and on the iterative total fault current.

4. The method according to claim 3, where the distance to fault of the current interations is determined according to $$d_{(n+1)} = \frac{real(\underline{V}_{Ap}) \cdot imag(\underline{I}_F(d_{(n)})) - imag(\underline{V}_{Ap}) \cdot real(\underline{I}_F(d_{(n)}))}{real(\Delta\underline{V}_p(d_{(n)})) \cdot imag(\underline{I}_F(d_{(n)})) - imag(\Delta\underline{V}_p(d_{(n)})) \cdot real(\underline{I}_F(d_{(n)}))}.$$

5. The method according to claim 3, where the iterative total fault current is determined by eliminating its zero sequence current component.

6. A device for locating a fault in a two-terminal power transmission or distribution line, the device comprising:
a processing unit,
an output interface connected to the processing unit,
a receiver configured to receive measurements of three phase currents from each of the two terminals connected to the processing unit,
a receiver configured to receive measurements of three phase voltages from one of the two terminals connected to the processing unit,
a receiver configured to receive transmission parameters of the line connected to the processing unit,
a receiver configured to receive the fault type connected to the processing unit,
wherein the processing unit is configured to
determine the symmetrical current and voltage components corresponding to the phase currents and phase voltages,
determine a fault loop voltage seen from the one of the two terminals based on the corresponding symmetrical voltage components and on the fault type,
determine a fault loop current seen from the one of the two terminals based on the symmetrical current components of the one of the two terminals, on the transmission parameters and on the fault type,
determine a total fault current based on the symmetrical current components and on the fault type,
determine the distance to fault seen from the one of the two terminals based on the fault loop voltage on the fault loop current and on the total fault current, and
output the distance to fault to an output interface.

7. The device according to claim 6, wherein the device is a current differential relay to protect the transmission or distribution line.

8. A computer program product, comprising:
a non-transitory computer readable medium; and
computer program recorded on the computer readable medium and executable by a processor for carrying out the steps of the method comprising receiving measurements of three phase currents from each of two terminals,
receiving measurements of three phase voltages from one of the two terminals of a two-terminal power transmission or distribution line,
receiving transmission parameters of the distribution line,
receiving the fault type,
determining the symmetrical current and voltage components corresponding to the phase currents and phase voltages,
determining a fault loop voltage seen from the one of the two terminals based on the corresponding symmetrical voltage components and on the fault type,
determining a fault loop current seen from the one of the two terminals based on the symmetrical current components of the one of the two terminals, on the transmission parameters and on the fault type,
determining a total fault current based on the symmetrical current components and on the fault type,
determining the distance to fault seen from the one of the two terminals based on the fault loop voltage, on the fault loop current and on the total fault current, and
outputting the distance to fault to an output interface.

* * * * *